(12) United States Patent
Higashiyama

(10) Patent No.: US 11,703,194 B2
(45) Date of Patent: Jul. 18, 2023

(54) LIGHT-EMITTING DEVICE AND METHOD FOR MANUFACTURING SAME

(71) Applicant: STANLEY ELECTRIC CO., LTD., Tokyo (JP)

(72) Inventor: Tsuzumi Higashiyama, Tokyo (JP)

(*) Notice: Subject to any disclaimer, the term of this patent is extended or adjusted under 35 U.S.C. 154(b) by 0 days.

(21) Appl. No.: 17/636,513

(22) PCT Filed: Aug. 3, 2020

(86) PCT No.: PCT/JP2020/029703
§ 371 (c)(1),
(2) Date: Feb. 18, 2022

(87) PCT Pub. No.: WO2021/033526
PCT Pub. Date: Feb. 25, 2021

(65) Prior Publication Data
US 2022/0282841 A1    Sep. 8, 2022

(30) Foreign Application Priority Data

Aug. 22, 2019  (JP) .................. 2019-151864

(51) Int. Cl.
*F21K 9/66* (2016.01)
*F21K 9/90* (2016.01)
(Continued)

(52) U.S. Cl.
CPC .................. *F21K 9/66* (2016.08); *F21K 9/90* (2013.01); *F21V 19/0025* (2013.01);
(Continued)

(58) Field of Classification Search
CPC .......... F21K 9/66; F21K 9/90; F21V 19/0025; F21V 31/005; F21Y 2101/00;
(Continued)

(56) References Cited

U.S. PATENT DOCUMENTS

| | | | |
|---|---|---|---|
| 2002/0142517 A1 | 10/2002 | Maeda et al. | |
| 2003/0230751 A1* | 12/2003 | Harada | H01L 33/44 257/E33.072 |

(Continued)

FOREIGN PATENT DOCUMENTS

| | | | |
|---|---|---|---|
| JP | 2000133868 A | 5/2000 | |
| JP | 2004158728 A | 6/2004 | |

(Continued)

OTHER PUBLICATIONS

International Search Report (ISR) (and English language translation thereof) dated Oct. 20, 2020, issued in International Application No. PCT/JP2020/029703.

(Continued)

*Primary Examiner* — Tsion Tumebo
(74) *Attorney, Agent, or Firm* — Holtz, Holtz & Volek PC

(57) ABSTRACT

A light-emitting device includes an ultraviolet light LED sealed in a package. The LED is bonded to a substrate with an alloy bonding material. The LED is covered with an enclosed gas containing oxygen gas and further covered with a lid member that is hermetically bonded to the substrate. The lid member defines a space filled with the enclosed gas and constitutes the package. The lid member transmits the ultraviolet light emitted from the LED.

13 Claims, 4 Drawing Sheets

(51) Int. Cl.
  *F21V 19/00* (2006.01)
  *F21V 31/00* (2006.01)
  *F21Y 115/10* (2016.01)
  *F21Y 101/00* (2016.01)
(52) U.S. Cl.
  CPC ......... *F21V 31/005* (2013.01); *F21Y 2101/00* (2013.01); *F21Y 2115/10* (2016.08)
(58) Field of Classification Search
  CPC ............... F21Y 2115/10; H01L 25/167; H01L 2933/0033; H01L 33/486; H01L 33/483
  See application file for complete search history.

(56) References Cited

U.S. PATENT DOCUMENTS

| | | |
|---|---|---|
| 2006/0163601 A1 | 7/2006 | Harle et al. |
| 2006/0281202 A1 | 12/2006 | Ishida et al. |
| 2012/0256533 A1* | 10/2012 | Seto .................... C04B 35/6268 252/301.4 R |
| 2012/0267671 A1 | 10/2012 | Jung et al. |
| 2017/0263834 A1* | 9/2017 | Yamaguchi ............ H01L 33/56 |
| 2018/0145237 A1 | 5/2018 | Park et al. |
| 2018/0219124 A1* | 8/2018 | Toita ...................... H01L 33/32 |
| 2019/0062633 A1* | 2/2019 | Wakui ................... H01L 33/502 |
| 2019/0088818 A1 | 3/2019 | Niizeki et al. |
| 2019/0189862 A1* | 6/2019 | Ichinokura .............. H01L 33/54 |
| 2019/0189870 A1* | 6/2019 | Ichinokura .............. H01L 33/40 |

FOREIGN PATENT DOCUMENTS

| | | |
|---|---|---|
| JP | 2005509269 A | 4/2005 |
| JP | 2006519481 A | 8/2006 |
| JP | 2006344727 A | 12/2006 |
| JP | 2009105343 A | 5/2009 |
| JP | 2011222568 A | 11/2011 |
| JP | 2012227511 A | 11/2012 |
| JP | 2013033891 A | 2/2013 |
| JP | 2016219505 A | 12/2016 |
| JP | 2019102631 A | 6/2019 |
| WO | 2018105327 A1 | 6/2018 |

OTHER PUBLICATIONS

Written Opinion dated Oct. 20, 2020, issued in International Application No. PCT/JP2020/029703.
International Preliminary Report on Patentability (IPRP) (and English language translation thereof) dated Mar. 3, 2022, issued in International Application No. PCT/JP2020/029703.

* cited by examiner

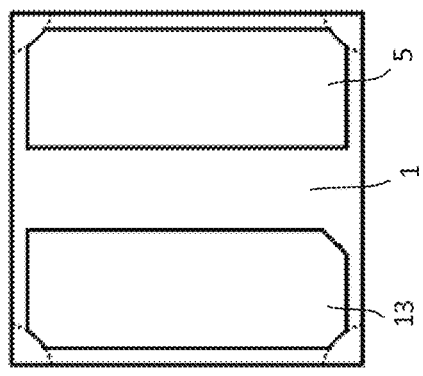
FIG. 1 (a) LIGHT-EMITTING DEVICE
FIG. 1 (b)
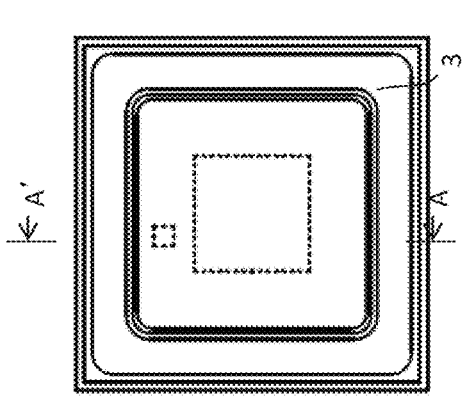
FIG. 1 (c)
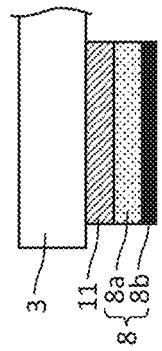
FIG. 1 (e)
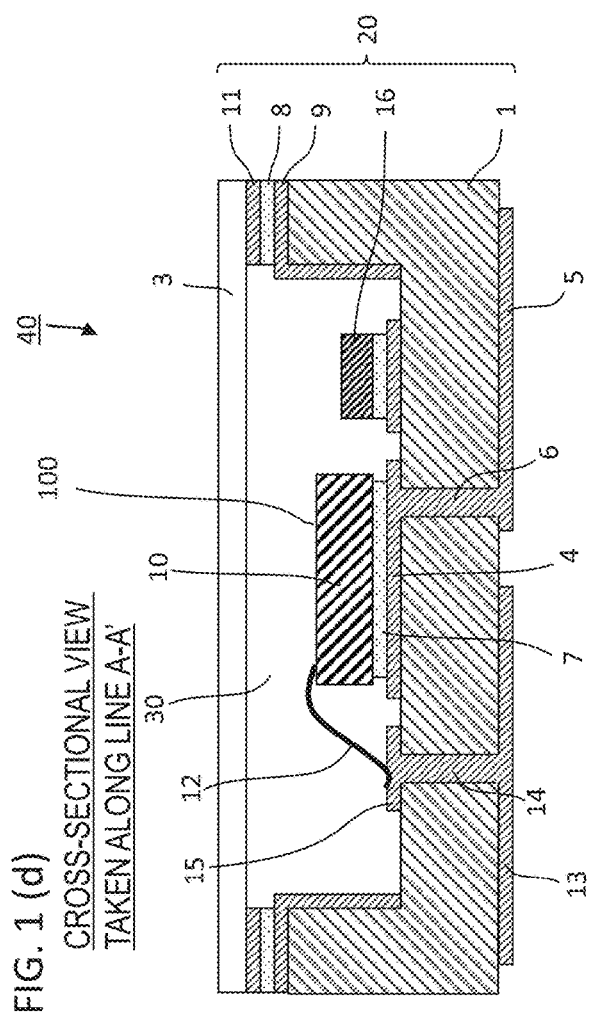
FIG. 1 (d) CROSS-SECTIONAL VIEW TAKEN ALONG LINE A-A'

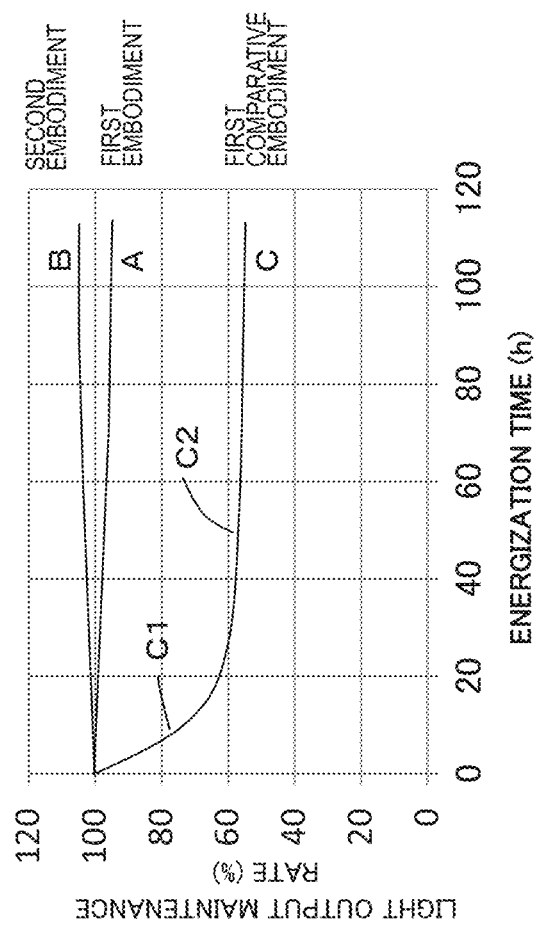

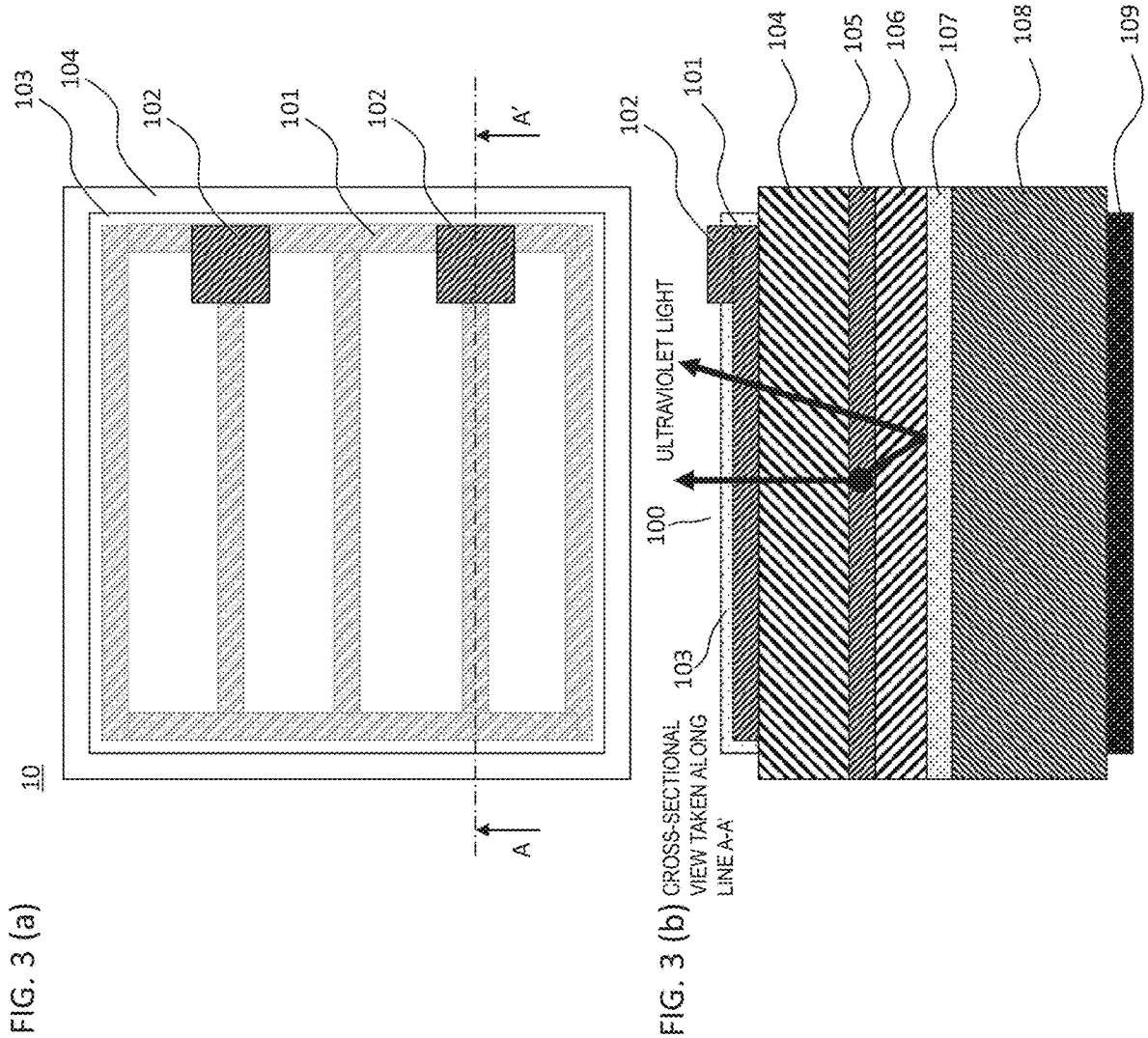

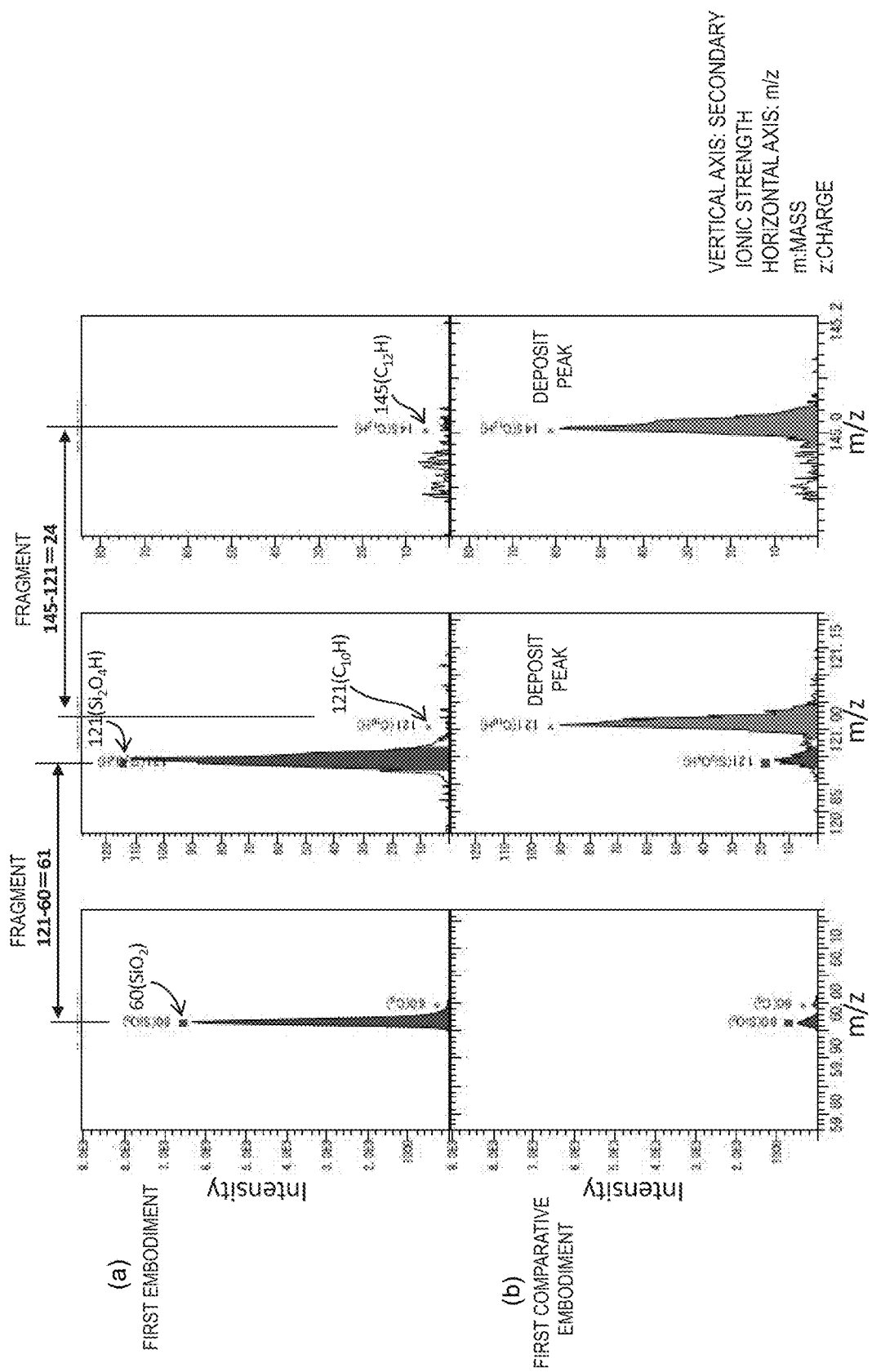

LIGHT-EMITTING DEVICE AND METHOD FOR MANUFACTURING SAME

TECHNICAL FIELD

The present invention relates to a light-emitting device in which a semiconductor light-emitting element (LED) is hermetically mounted on a substrate.

BACKGROUND ART

It is known from PTL 1 and the like that in a semiconductor laser module in which a high-output semiconductor laser is hermetically sealed in a package, a trace amount of hydrocarbon used in a manufacturing process and remaining inside the package is polymerized by light emitted from the semiconductor laser, and a generated organic substance adheres to a light-emitting end face of the semiconductor laser, causing an element end face to melt and break. To prevent this, oxygen can be mixed with a hermetic sealing gas to prevent polymerization of the hydrocarbon. However, when oxygen is mixed with a sealing gas, the oxygen reacts with hydrogen inside the module and becomes water, and condenses inside the package, which causes a decrease in light output and a short circuit of electric wiring, and therefore, PTL 1 provides a configuration that prevents condensation by disposing a hydrogen storage member in a package.

CITATION LIST

Patent Literature

PTL 1: JP-A-2000-133868

SUMMARY OF INVENTION

Technical Problem

There is known a light-emitting device in which an LED (hereinafter, also referred to as a light-emitting element or a semiconductor light-emitting element) is sealed in a package instead of a semiconductor laser. However, according to experiments conducted by the present inventors, it has been newly found that when an LED that emits ultraviolet light is used, water is not generated when the LED emits light, but carbides may be deposited on a surface of the light-emitting element, and light output may be reduced.

An object of the invention is to provide a light-emitting device in which an ultraviolet light LED (an LED that emits ultraviolet light) is sealed in a package, and to maintain light output.

Solution to Problem

To achieve the above-described object, a light-emitting device of the invention includes an LED that emits ultraviolet light; an enclosed gas containing oxygen gas; a substrate that is hermetic to the enclosed gas; a bonding material that is made of an alloy and bonds the LED to the substrate; a lid member that covers the LED, defines a space filled with the enclosed gas, transmits the ultraviolet light emitted from the LED, and is hermetic to the enclosed gas; and a lid bonding material that hermetically bonds the substrate and the lid member.

Advantageous Effect

The invention can provide a light-emitting device which has an ultraviolet light LED sealed in a package and maintains light output.

BRIEF DESCRIPTION OF DRAWINGS

FIG. 1(a) is a top view of a light-emitting device according to an embodiment, FIG. 1(b) is a side view of the light-emitting device, FIG. 1(c) is a bottom view of the light-emitting device, FIG. 1(d) is a cross-sectional view taken along line A-A', and FIG. 1(e) is a cross-sectional view of a lid bonding material 8 before bonding.

FIG. 2 is a graph showing a relation between an energization time and a light output maintenance rate of the light-emitting device of embodiments.

FIG. 3(a) is a top view of an LED 10 used in the light-emitting device manufactured in the embodiments, and FIG. 3(b) is a cross-sectional view taken along line A-A'.

FIG. 4 is a graph showing TOF-SIMS spectra of light-emitting surfaces of light-emitting elements after light-emitting devices manufactured in a first embodiment and a first comparative embodiment are energized.

DESCRIPTION OF EMBODIMENTS

A light-emitting device according to an embodiment of the invention will be described with reference to the drawings.

The inventors have found that in a light-emitting device having a structure in which an LED that emits ultraviolet light is sealed in a space inside a package, a light-emitting surface of the LED is blackened and light output is reduced when the LED emits light. The cause thereof was examined by TOF-SIMS (secondary ion mass spectrometry), and it was found that an inorganic carbide was deposited on a surface of the LED.

It was considered that the carbide deposited on the light-emitting surface of the LED was caused by a flux residue contained in a bonding material used when bonding the LED to a substrate.

The inventors have found that by enclosing oxygen gas at an appropriate concentration in the space inside the package, the flux residue can be prevented from being deposited as an inorganic carbide on the light-emitting surface of the LED, and light output can be maintained. This will be described in detail below.

As shown in FIG. 1(a) to FIG. 1(d), the light-emitting device of the present embodiment includes an LED 10 (FIG. 3) that emits ultraviolet light, and a package 20. The package 20 includes a space 30 therein, and the LED 10 is placed in the space 30 via a bonding material 7. The space 30 is filled with an enclosed gas containing oxygen gas in addition to the LED 10, and is hermetically sealed.

The package 20 further includes a substrate 1 having a cavity (recess), a lid member 3 that covers an opening of the cavity, and a lid bonding material 8 that hermetically seals the lid member 3 and the substrate 1.

The substrate 1 uses an aluminum nitride base material that can maintain hermeticity of the package 20. As the base material, a ceramic made of a nitride, a carbide, or an oxide such as silicon nitride ($Si_3N_4$), silicon carbide (SiC), or aluminum oxide ($Al_2O_3$) can be used in addition to aluminum nitride (AlN). By using the substrate 1 of a ceramic base material, heat generated by the LED 10 can be efficiently dissipated, and light output can be maintained for a long period because the substrate 1 has ultraviolet resistance.

A metal layer 4 electrically connected to a first electrode 109 of the LED 10 and a metal layer 15 electrically connected to a second electrode pad 102 on a second electrode 101 of the LED 10 via a bonding wire are provided on a bottom surface of the cavity of the substrate 1. The metal layer 4 and the metal layer 15 are layers of silver (Ag) or a silver alloy, and surfaces thereof have a structure in which tungsten (W) and/or nickel (Ni) and gold (Au) are laminated in order from the substrate 1 side by plating.

The metal layer 4 and the metal layer 15 are electrically connected to a back surface electrode 5 and a back surface electrode 13 disposed on a back surface of the substrate 1, respectively, by a through electrode 6 and a through electrode 14. The back surface electrodes 5 and 13 are layers of Ag or a silver alloy, and surfaces thereof have a structure in which W and/or Ni and Au are laminated in order from the substrate 1 side by plating.

A metal ring body 9 is disposed on an upper flat surface (a surface parallel to the bottom surface of the cavity of the substrate 1) of a side wall defining the cavity of the substrate 1. The metal ring body 9 has, for example, a structure in which W and/or Ni and Au are laminated in order from the substrate 1 side by plating. The metal ring body 9 can also extend to a side wall surface defining the cavity of the substrate 1. Accordingly, reflectance of light emitted from the LED 10 can be increased. Since the metal ring body 9 covers the side wall surface defining the cavity of the substrate 1, an exposed area of the ceramic as the base material can be reduced, and a flux residue which becomes a carbide due to ultraviolet light described later can be prevented from adhering.

Here, the structure in which the cavity is provided in the substrate 1 has been described, but the substrate 1 may be a flat plate and the cavity may be provided on the lid member 3 side. The cavity may also be provided in both the substrate 1 and the lid member 3. The cavity of the substrate 1 may be formed by bonding a frame body to the plate-shaped substrate 1 in addition to integral molding.

As the LED 10, an aluminum nitride-based or gallium nitride-based semiconductor light-emitting element that includes at least a p-type semiconductor layer, a light-emitting layer, and an n-type semiconductor layer and emits ultraviolet light having a wavelength of 240 nm to 405 nm can be used.

The LED 10 includes the first electrode 109 for energizing, the second electrode 101 having a polarity different from that of the first electrode 109, and the second electrode pads 102 on the second electrode. The LED 10 further includes a light-emitting surface 100 that emits ultraviolet light.

Although the electrodes and the electrode pad are omitted in FIG. 1(d), the first electrode 109 is on a surface in contact with the bonding material 7, and the second electrode pads 102 are on an upper surface of the LED 10.

The first electrode 109 of the LED 10 is electrically bonded to an upper side of the metal layer 4 on the bottom surface of the cavity of the substrate 1 via the bonding material 7. The second electrode pad 102 is electrically connected to the metal layer 15 on the bottom surface of the cavity by a bonding wire 12.

A gold-tin alloy (Au—Sn alloy) can be used as the bonding material 7. In addition to the Au—Sn alloy as the bonding material 7, for example, an alloy such as a tin-silver-based alloy, a tin-copper-based alloy, a tin-zinc-based alloy, and a tin-bismuth-based alloy can be used.

Either an inner wall of the package 20 or the bonding material 7 contains an organic substance (flux residue) carbonized by ultraviolet light. Here, the bonding material 7 includes grain boundaries of the Au—Sn alloy and voids of about 10% to 30%, and the organic substance (flux residue) carbonized by ultraviolet light may also be included in these grain boundaries and voids. The voids are included in the bonding material 7 in a region sandwiched between the LED and the substrate.

The organic substance (flux residue) contained in either the inner wall of the package 20 or the bonding material 7 has a property of being carbonized by being irradiated with ultraviolet light in an atmosphere with no oxygen or an atmosphere with little oxygen (about 1 vol % of oxygen gas).

As the LED 10, an LED in which the first electrode and the second electrode are provided in the same plane (for example, one surface an LED configured by a hexahedron) can be used in addition to the LED described above. In this case, the first electrode and the metal layer 4, and the second electrode and the metal layer 15 are all bonded by the bonding material 7 (flip bonding). The light-emitting surface in this case is a surface opposite to the surface on which the first electrode and the second electrode are provided.

An LED in which the first electrode, the second electrode, and the light-emitting surface are provided in the same plane can also be used. In this case, the surface opposite to the surface on which the first electrode and the second electrode are provided is bonded to the metal layer 4 via the bonding material 7. The first electrode is connected to the metal layer 4 by the bonding wire 12, and the second electrode is connected to the metal layer 15 by the bonding wire 12.

A Zener diode 16 can also be used. In this case, one electrode of the Zener diode 16 is bonded to the metal layer 4 via the bonding material 7, and the other electrode is bonded to the metal layer 15 via the bonding material 7.

As the enclosed gas, a gas containing oxygen gas at a concentration of 5 vol. % or more can be used. As will be described in detail later, by filling the space 30 with an enclosed gas containing oxygen gas, it is possible to prevent an organic substance as the flux residue from being carbonized and deposited as a carbide on the light-emitting surface 100 of the LED 10 by the ultraviolet light emitted from the LED 10.

As the enclosed gas, nitrogen ($N_2$) gas can be used as an interpolation gas in addition to oxygen gas. As the interpolation gas, an inert gas such as argon (Ar), krypton (Kr), and xenon gas (Xe) can be used in addition to $N_2$ gas. The interpolation gas can be used alone or in combination of two or more kinds. This is because the enclosed gas can prevent vapor diffusion of the flux residue and the carbide deposition on the light-emitting surface 100 of the LED 10 due to an increase in an average molecular weight of the enclosed gas. This is also because the enclosed gas can prevent the carbide deposition on the light-emitting surface 100 of the LED 10 due to an increase in a filling pressure of the enclosed gas.

The lid member 3 uses plate-shaped borosilicate glass that transmits the ultraviolet light emitted from the LED 10. In addition to borosilicate glass, quartz glass, sapphire glass, or the like can be used.

In the lid member 3, a metalized layer 11 is disposed around the periphery facing the upper surface of the side wall defining the cavity of the substrate 1. The metallized layer 11 has a structure in which chromium (Cr), nickel (Ni), and gold (Au) are laminated in order from the lid member 3 side by plating or the like.

Here, the plate-shaped lid member 3 has been described, but a structure in which the cavity (recess) is provided on the lid member side may be adopted. The cavity may be provided in both the substrate 1 and the lid member 3. The cavity of the lid member 3 may be formed by joining a frame body made of glass or an iron-nickel-cobalt alloy (trade name: Kovar (registered trademark)) to a glass plate.

The lid joining material 8 is disposed between the metal ring body 9 of the substrate 1 and the metallized layer 11 of the lid member 3, and joins (hermetically seals) the substrate 1 and the lid member 3. The lid joining material 8 uses an Au—Sn alloy (20 wt. % Sn). The Au—Sn alloy used as the lid bonding material 8 uses no flux. This is to prevent the flux residue from excessively entering the space 30.

This is because, for example, even if the space 30 is filled with an enclosed gas containing 5 vol. % or more of oxygen gas, it is impossible to prevent the carbide from being deposited on the light-emitting surface of the LED 10 when the flux residue enters the space 30 from the lid bonding material 8.

As described above, a light-emitting device 40 can supply electric power to the first electrode 109 and the second electrode pads 102 of the LED 10 via the metal layer 4 and the bonding material 7, and the metal layer 15 and the bonding wire 12 by supplying an electric current between the back surface electrodes 5 and 13, and can make the LED 10 emit ultraviolet light.

It is possible to provide the light-emitting device that can prevent the organic substance of the flux component from being deposited on the light-emitting surface 100 of the LED 10 as a carbide carbonized by ultraviolet light, and can maintain the light output.

Here, the configuration of the light-emitting device shown in FIG. 1 has been mainly described, but the invention is not limited thereto. For example, a plurality of LEDs 10 may be provided in the space 30. A light-receiving element for ultraviolet light may be used instead of the LED 10.

Next, a method for manufacturing the light-emitting device 40 according to the present embodiment will be described with reference to examples.

EMBODIMENTS

First Embodiment

A light-emitting device having the structure shown in FIG. 1(a) to FIG. 1(d) and having 20 vol. % of oxygen gas and 80 vol. % of nitrogen gas as an enclosed gas in the space 30 is manufactured.

First, a substrate 1 of an AlN base material is prepared, in which metal layers 4 and 15 and through electrodes 6 and 14 penetrating from a bottom surface of a cavity to a back surface of the substrate 1 are formed on the bottom surface of the cavity, back surface electrodes 5 and 13 are formed on the back surface of the substrate, and a metal ring body 9 is formed on an upper surface of a side wall defining the cavity.

Next, an LED 10 that emits light having a wavelength of 365 nm is prepared.

The specific configuration of the prepared LED 10 is shown in FIG. 3(a) and FIG. 3(b). In the LED 10, a semiconductor layer including a p-type nitride layer 106, a light-emitting layer 105, and an n-type nitride layer 104 is laminated on a conductive support substrate 108 made of silicon (Si) via a bonding layer 107 made of a metal. A second electrode (cathode electrode) 101, second electrode pads 102, and a silicon dioxide ($SiO_2$) film as a protective film 103 are provided on the n-type nitride layer 104. The p-type nitride layer 106 includes the support substrate 108 and a first electrode (anode electrode) 109 via the bonding layer 107 that serves as both an ohmic electrode and a reflective layer. A part of the ultraviolet light emitted from the light-emitting layer 105 transmits through the n-type nitride layer 104 and is emitted from the light-emitting surface 100 on the upper surface. The other part of the ultraviolet light transmits through the p-type nitride layer 106, and is reflected by the bonding layer 107 and then emitted from the light-emitting surface 100 on the upper surface.

Next, a volatile solder paste of an Au—Sn alloy (20 wt. % Sn) serving as the bonding layer 7 is applied onto the metal layer 4 on the bottom surface of the cavity of the substrate 1, and the LED 10 is temporarily attached to the metal layer 4. Then, the substrate 1 is placed in a reflow furnace and heated to about 300° C. to melt fine particles of the Au—Sn alloy contained in the solder paste, thereby forming and bonding the bonding material 7 between the metal layer 4 and the first electrode 109 of the LED 10. At this time, the LED 10 is self-aligned on the metal layer 4 by the melted Au—Sn alloy. Grain boundaries of the Au—Sn alloy and voids of about 10% to 30% are formed inside the bonding material 7.

The volatile solder paste (also referred to as residue-free solder paste) consists of several nanometers to several tens of microns of fine particles of an alloy used as the bonding material 7, and a flux that is liquid at room temperature and contains a plurality of organic substances such as rosins, alcohols, sugars, esters, fatty acids, fats and oils, polymerized oils, surfactants, and organic acids. The boiling point of the organic substances contained in the volatile flux is about the same as a melting temperature of the alloy, and most of the flux volatilizes during bonding.

When used, a Zener diode 16 is bonded at the same time as the LED 10.

Next, the substrate 1 on which the LED 10 and the Zener diode 16 are mounted is cleaned with a solvent to remove the flux residue. This is because an organic substance that is deposited as a carbide on the light-emitting surface of the LED 10 and is a flux residue sufficient to reduce the light output remains in the light-emitting device 40 in which the ultraviolet light LED 10 is placed in a space 30. As a cleaning method, in addition to solvent cleaning, ozone cleaning in which oxidative decomposition is performed by ozone gas, excimer cleaning in which decomposition and removal are performed by excimer light, heat cleaning in which volatilization and removal are performed, and the like may be used.

As described above, since the flux residue can be reduced by performing cleaning after LED 10 is bonded, the oxygen concentration of the enclosed gas can be 5 vol. % or more. In contrast, the residual amount of the flux residue is large when cleaning is not performed, and it is possible to prevent the carbide from being deposited on the light-emitting surface 100 of the LED 10 by setting the oxygen concentration of the enclosed gas to 7 vol. % or more.

Next, the second electrode pad 102 of the LED 10 and the metal layer 15 on the bottom surface of the cavity are connected by the bonding wire 12 using a wire bonder.

Meanwhile, a borosilicate glass plate is prepared as the lid member 3. The metalized layer 11 in which chromium (Cr), nickel (Ni), and gold (Au) are laminated is formed on the periphery of a lower surface of the lid member 3 ((e) in FIG.

1) by vapor deposition, and an annular Au—Sn alloy (20 wt. % Sn) sheet serving as the lid bonding material 8 is pressure-bonded to a surface of the metalized layer 11. The alloy sheet contains no flux.

In the present embodiment, a laminated body in which an Au—Sn alloy layer 8a and an Au layer 8b having a thickness of several tens of nanometers are laminated is used as the lid bonding material 8. The Au—Sn alloy layer 8a side is pressure-bonded to the metallized layer 11 so that the Au layer 8b serves an antioxidant film.

To bond the substrate 1 and the lid member 13, first, the substrate 1 on which the LED 10 is mounted and the lid member 13 are set in a bonding device capable of adjusting the composition of the enclosed gas (bonding step 1). The inside of the bonding device is heated while being replaced with a gas containing 20 vol. % oxygen gas and 80 vol. % nitrogen gas as the enclosed gas at atmospheric pressure (bonding step 2). The lid member 13 is pressed against the substrate 1 to seal a space 3 before the temperature of the lid bonding material 8 reaches its melting temperature (bonding step 3). The lid bonding material 8 is heated to the melting temperature and bonded, and the space 3 is hermetically sealed (bonding step 4).

In the bonding step 2, since the Au layer 8b is laminated on the Au—Sn alloy layer 8a, the Au—Sn alloy layer 8a is not in direct contact with the enclosed gas, and oxidation can be prevented. In the bonding step 4, since the lid bonding material 8 is in close contact with the metal ring body 9 and the metallized layer 11 while being sandwiched therebetween, the lid bonding material 8 can be bonded without being oxidized. The Au layer 8b does not interfere with the bonding since the Au layer 8b is melted as the Au—Sn alloy layer 8a is melted.

However, if the oxygen gas concentration is too high, components and the like of the bonding device are deteriorated, and therefore, the concentration is preferably 30 vol. % or less. It is also possible to adjust the oxygen gas concentration of the enclosed gas to 20 vol. % or less by mixing an interpolation gas with dry air (oxygen gas: nitrogen gas≈1:4) obtained by removing moisture from the air instead of the oxygen gas and the nitrogen gas. According to this method, it is not necessary to separately prepare oxygen gas, and manufacturing costs can be reduced.

Finally, cooling is performed to complete the bonding step.

As described above, the light-emitting device 40 in which 20 vol. % of oxygen gas and 80 vol. % of nitrogen were enclosed in the space 30 was manufactured.

Second Embodiment

As the second embodiment, a light-emitting device was manufactured in a similar manner as in the first embodiment except that the enclosed gas to be enclosed in the space 30 was changed to 10 vol. % of oxygen gas and 90 vol. % of nitrogen.

First Comparative Embodiment

As the first comparative embodiment, a light-emitting device was manufactured in a similar manner as in the first embodiment except that the enclosed gas to be enclosed in the space 30 was changed to 1 vol. % of oxygen gas and 99 vol. % of nitrogen.

Second Comparative Embodiment

As the second comparative embodiment, a light-emitting device was manufactured in a similar manner as in the first embodiment except that the enclosed gas to be enclosed in the space 30 was changed to 100 vol. % of nitrogen.

(Evaluation)

Evaluation of the light-emitting devices of the first and second embodiments and the first and second comparative embodiments after continuous lighting for 100 hours is shown in Table 1 and will be described below.

TABLE 1

Evaluation Table of 100-hour Lighting of Light-Emitting Device

| Item | First Embodiment | Second Embodiment | First Comparative Embodiment | Second Comparative Embodiment |
|---|---|---|---|---|
| Emission wavelength (nm) | 365 | 365 | 365 | 365 |
| Enclosed gas (vol. %) | 20 oxygen:80 nitrogen | 10 oxygen:90 nitrogen | 1 oxygen:99 nitrogen | 0 oxygen:100 nitrogen |
| Properties | No discoloration no deposit | No discoloration no deposit | Black deposit | Black deposit |
| Electrical characteristics | No abnormality | No abnormality | No abnormality | No abnormality |
| Light output maintenance rate | 96.4% | 105.9% | 54.0% | 58.7% |

As for properties, the light-emitting surface of the LED was visually observed and observed with a microscope to check whether the LED was discolored after lighting and whether there was any deposit.

As for electrical characteristics, voltage and current characteristics (V and I characteristics), a forward leak voltage (Vf), and a reverse leak voltage (Vr) were examined.

A light output maintenance rate (%) was obtained by dividing the light output after 100 hours of continuous lighting by the light output at an initial stage of lighting (immediately after lighting) and multiplying by 100.

Properties of the light-emitting surfaces of the LEDs of the light-emitting devices in the first and second embodiments were colorless, and carbide deposition was not observed. The same applies to the wall surfaces defining the space 30. No values were measured that were found to be abnormal in the electrical characteristics. The light output maintenance rate was 96.4% in the first embodiment and was 105.9% in the second embodiment, which were in a range of an aging amount derived from the structure and a manufacturing lot of the LED 10.

In contrast, the properties of the light-emitting surfaces of the LEDs of the light-emitting devices in the first and second comparative embodiments were brown or black, and carbide deposition was observed. No values were measured that were found to be abnormal with respect to the electrical characteristics. The light output maintenance rate was 54.0% in the first comparative embodiment and was 58.7% in the second comparative embodiment, which were reduced to about half from an initial lighting value.

From the above-described results, it was confirmed that by enclosing oxygen gas in the space 30 at the concentration of 20 vol. % (the first embodiment) and the concentration of 10 vol. % (the second embodiment), the carbide can be prevented from being deposited on the light-emitting surface without impairing the properties and the electrical characteristics of the light-emitting surface, and the light output is maintained.

Next, a relation between an energization time and the light output maintenance rate of the light-emitting devices in the first and second embodiments and the first comparative embodiment will be described with reference to FIG. 2.

First, a curve A of the light output maintenance rate in the first embodiment gradually decreases as the energization time elapses. A curve B of the light output maintenance rate in the second embodiment gradually increases. The gradual decrease and increase are caused by aging due to the structure, the manufacturing lot, and the like of the LED.

In contrast, a curve C of the light output maintenance rate in the first comparative embodiment includes a steep attenuation curve C1 corresponding to the carbide deposition on the light-emitting surface and a gentle attenuation curve C2 due to aging. The attenuation curve C1 disappears when the oxygen gas concentration of the enclosed gas is 5 vol. % or more. That is, this is because the carbide can be prevented from being deposited on the light-emitting surface.

Next, results of measuring the light-emitting surfaces of the LEDs after energization of the light-emitting devices in the first embodiment and the first comparative embodiment by time-of-flight secondary ion mass spectrometry (ToF-SIMS) will be described with reference to FIG. 4.

In FIG. 4, the horizontal axis (m/Z) represents a mass-to-charge ratio of secondary ions, where m represents the mass and Z represents the charge. Intensity on the vertical axis is a detection intensity of the secondary ions.

In a measurement result (a) of the light-emitting device in the first embodiment, strong peaks are observed at the mass-to-charge ratios (m/Z) of 60 and 121. A fragment was identified as a silicon dioxide ($SiO_2$) of the protective film 103 since the fragment was 61. Peaks related to carbides or organic substances are not observed.

Next, in a measurement result (b) of the light-emitting device in the first comparative embodiment, strong peaks are observed at the mass-to-charge ratios (m/Z) of 121 and 145. A fragment was identified as an inorganic carbide such as graphite, diamond-like carbon (DLC), and amorphous carbon since the fragment was 24. A slight peak of a silicon dioxide of the protective film 103 is also observed.

From these results, it was confirmed that the deposit on the light-emitting surface of the LED in the light-emitting device in the first comparative embodiment was a carbide.

Apart from this, in a light-emitting device in which an LED having a wavelength of 365 nm is bonded to the metal layer 4 by thermo-compression bonding using only an Au—Sn alloy as the bonding material 7 (enclosed gas is nitrogen only), carbide deposition was not observed on the light-emitting surface of the LED. From the above, it was confirmed that the flux residue (organic substance of the flux component) was carbonized by ultraviolet light and became an inorganic carbide.

That is, even in the case of a volatile Au—Sn alloy solder paste, the flux remains in the metal grain boundaries and voids of the bonding material 7, and the volatilized flux remains on (adheres to) the inner wall of the package such as a surface of a ceramic substrate. This is because the remaining flux is volatilized even at a degree of heat generation (60° C. to 80° C.) due to energization of the ultraviolet light LED, and is carbonized by the ultraviolet light emitted from the LED and deposited as a carbide on the light-emitting surface in an environment of an enclosed gas containing no oxygen gas or containing a small amount of oxygen gas (1 vol. % of oxygen gas).

Third Comparative Embodiment

As the third comparative embodiment, light-emitting devices having three types of wavelengths were manufactured in a similar manner as in the second comparative embodiment except that the wavelength of the ultraviolet light LED 10 was changed to 355 nm, 385 nm, and 405 nm.

Fourth Comparative Embodiment

As the fourth comparative embodiment, a light-emitting device was manufactured in a similar manner as in the second comparative embodiment except that the wavelength of the LED 10 was changed to 445 nm.

Fifth Comparative Embodiment

As the fifth comparative embodiment, a light-emitting device was manufactured in a similar manner as in the second comparative embodiment except that the wavelength of the LED 10 was changed to 855 nm.

The light emitting devices in the third comparative embodiment to the fifth comparative embodiment were also evaluated for properties observation, electrical characteristics, and light output maintenance rate after continuous lighting for 100 hours.

As a result, the light output maintenance rates of the light-emitting devices having three types of wavelengths in the third comparative embodiment after continuous lighting for 100 hours were 65% or less, and carbide deposition was observed on the light-emitting surface of the LED.

In contrast, the light output maintenance rates of the light-emitting devices in the fourth and fifth comparative embodiments after continuous lighting for 100 hours were 95.5% and 97.4%, respectively, which were in the aging range, and no carbide deposition was observed on the light-emitting surface of the LED in either case.

That is, in a light-emitting device using a visible light LED having a wavelength of 445 nm or an infrared light LED having a wavelength of 855 nm, carbides are not deposited on the light-emitting surface even in the case of an enclosed gas containing no oxygen gas. Accordingly, the carbide deposition on the light-emitting surface is a phenomenon that occurs in a light-emitting device using an ultraviolet light LED having a wavelength of at least 405 nm or less.

As described above, in the light-emitting device in which the ultraviolet light LED 10 is bonded to the space 30 in the package 20 by using a volatile solder paste, the problem that carbides are deposited on the light-emitting surface of the LED 10 and the light output is reduced is solved by filling the space 30 with an enclosed gas having an oxygen gas concentration of 5 vol. % or more. Accordingly, a light-emitting device in which the light output is maintained can be provided. By using an enclosed gas having an oxygen gas concentration of 30 vol. % or less, it is also possible to prevent component deterioration of a bonding device that bonds (hermetically seals) the substrate 1 and the lid member 3.

The light-emitting device of each of the embodiments described above can be used as an LED lighting device such as a curing light source of a resin, an excitation light source of an ultraviolet excitation agent, and a light source for sterilization.

REFERENCE SIGNS LIST 5 back surface electrode
6 through electrode
8 lid bonding material
8a Au—Sn layer
8b Au layer
9 metal ring body
10 LED
11 metallized layer
12 bonding wire
13 back surface electrode
14 through electrode
15 metal layer
16 zener diode
20 package

The invention claimed is:

1. A light-emitting device, comprising:
    an LED configured to emit ultraviolet light having a wavelength of 405 nm or less;
    an enclosed gas consisting of (i) oxygen gas in an amount in a range of 5 vol. % to 30 vol. % and (ii) an interpolation gas, the interpolation gas consisting of one or more of nitrogen gas and an inert gas;
    a substrate;
    a bonding material that is made of an alloy and bonds the LED to the substrate;
    a lid member that covers the LED and is configured to transmit the ultraviolet light emitted from the LED; and
    a lid bonding material that hermetically bonds the substrate and the lid member,
    wherein the substrate and the lid member constitute a package that is hermetic to the enclosed gas and defines a space that is filled with the enclosed gas;
    wherein any of an inner wall of the package and the bonding material that bonds the LED to the substrate contains an organic material that has a property of being carbonized to be an inorganic carbide by ultraviolet light in an atmosphere containing no oxygen gas.

2. The light-emitting device according to claim 1, wherein;
    the substrate is made of a ceramic material,
    the substrate comprises a cavity defined by a side wall,
    a metal ring body is disposed on an upper plane of the side wall, and
    the metal ring body extends to a side wall surface of the side wall defining the cavity.

3. The light-emitting device according to claim 2, wherein the alloy of the bonding material has a grain boundary containing the organic substance.

4. The light-emitting device according to claim 2, wherein the bonding material in the region sandwiched between the LED and the substrate has a void containing the organic substance.

5. The light-emitting device according to claim 4, wherein the organic substance includes one or more of rosins, alcohols, sugars, esters, fatty acids, fats and oils, polymerized oils, surfactants, and organic acids.

6. The light-emitting device according to claim 4, wherein the organic substance volatilizes at a melting temperature of the bonding material.

7. The light-emitting device according to claim 1, wherein the interpolation gas consists of one or more gas of nitrogen, argon, krypton, and xenon.

8. The light-emitting device according to claim 1, wherein an emission wavelength of the LED is 355 nm to 405 nm.

9. The light-emitting device according to claim 1, wherein the bonding material is any one of a gold-tin alloy, a tin-silver-based alloy, a tin-copper-based alloy, a tin-zinc-based alloy, and a tin-bismuth-based alloy.

10. The light-emitting device according to claim 1, wherein an oxygen concentration of the enclosed gas is in a range of 5 vol. % to 10 vol. %.

11. A method for manufacturing a light-emitting device, the method comprising:
    a first bonding step of bonding an LED, which is configured to emit ultraviolet light, to a substrate with a volatile solder paste to form an LED-mounted substrate; and
    a second bonding step of enclosing an enclosed gas in a space in which the LED mounted on the LED-mounted substrate is disposed, the enclosed gas consisting of (i) oxygen gas in an amount in a range of 5 vol. % to 30 vol. % and (ii) an interpolation gas, the interpolation gas including one or more of nitrogen gas and an inert gas, the enclosing the enclosed gas comprising covering the space in which the LED is disposed with a lid member configured to transmit the ultraviolet light emitted from the LED, thereby defining the space in which the LED is disposed, and hermetically sealing the LED-mounted substrate and the lid member with a sheet-shaped alloy;
    wherein the volatile solder paste contains an organic material that has a property of being carbonized to be an inorganic carbide by ultraviolet light in an atmosphere containing no oxygen gas.

12. The method for manufacturing a light-emitting device according to claim 11, wherein the sheet-shaped alloy has two layers, a surface layer in contact with the enclosed gas is a metal that is not oxidized by oxygen gas, and another layer is a metal that is oxidized by the oxygen.

13. The method for manufacturing a light-emitting device according to claim 12, wherein in the second bonding step, the surface layer of the sheet-shaped alloy is in close contact with the LED-mounted substrate before the alloy is melted.

* * * * *